United States Patent
Dorodnyy et al.

(10) Patent No.: US 12,025,555 B2
(45) Date of Patent: Jul. 2, 2024

(54) META-SURFACE PHOTODETECTOR

(71) Applicant: SENSIRION AG, Stäfa (CH)

(72) Inventors: Alexander Dorodnyy, Zürich (CH); Alexander Lochbaum, Zürich (CH); Jürg Leuthold, Zürich (CH); Lukas Bürgi, Stäfa (CH); Silvio Graf, Stäfa (CH)

(73) Assignee: SENSIRION AG, Stäfa (CH)

( * ) Notice: Subject to any disclaimer, the term of this patent is extended or adjusted under 35 U.S.C. 154(b) by 293 days.

(21) Appl. No.: 17/619,560

(22) PCT Filed: Jun. 19, 2020

(86) PCT No.: PCT/EP2020/067229
§ 371 (c)(1),
(2) Date: Dec. 15, 2021

(87) PCT Pub. No.: WO2021/001182
PCT Pub. Date: Jan. 7, 2021

(65) Prior Publication Data
US 2022/0307974 A1    Sep. 29, 2022

(30) Foreign Application Priority Data
Jul. 1, 2019 (EP) ..................... 19183649

(51) Int. Cl.
*G01N 21/3504* (2014.01)
*G01J 3/42* (2006.01)
(Continued)

(52) U.S. Cl.
CPC ............ *G01N 21/3504* (2013.01); *G01J 3/42* (2013.01); *H01L 31/028* (2013.01);
(Continued)

(58) Field of Classification Search
CPC ..... G01N 21/3504; G01J 3/42; H01L 31/028; H01L 31/0296; H01L 31/0304; H01L 31/03046
See application file for complete search history.

(56) References Cited

U.S. PATENT DOCUMENTS

| 8,698,207 B2 | 4/2014 | Yohan et al. |
| 2010/0013040 A1 | 1/2010 | Daisuke et al. |
| 2019/0148569 A1* | 5/2019 | Meyer ................ G02B 6/12004 257/432 |

FOREIGN PATENT DOCUMENTS

| NL | 9100683 | 2/2001 |
| WO | 2015104294 | 7/2015 |

(Continued)

OTHER PUBLICATIONS

Hailong Huang et al.: Design of broadband graphene-metamaterial absorbers for permittivity sensing at mid-infrared regions, Scientific Reports, vol. 8, No. 1, 4183, 2018, pp. 1-10.
(Continued)

*Primary Examiner* — David P Porta
*Assistant Examiner* — Fani Polyzos Boosalis
(74) *Attorney, Agent, or Firm* — Mannava & Kang, P.C.

(57) ABSTRACT

A photodetector comprises a substrate, and supported by the substrate, a configuration to act as optical resonator and to absorb incident radiation of a band, including infrared. The configuration comprises: a resonant frontside structure facing the incident radiation; a backside structure and arranged between the frontside structure and the substrate; and a layer of an active material made from a semiconducting material, and configured to convert at least part of the incident radiation of the band into charge carriers. The frontside structure or the backside structure is made from electrically conducting material and is in contact with the active material. The configuration is configured to selectively absorb the (Continued)

incident radiation of the band. The frontside structure or the backside structure that is in contact with the active material is contacted by electrical contacts for sensing the charge carriers in the active material. The active material comprises amorphous or polycrystalline material.

11 Claims, 6 Drawing Sheets

(51) Int. Cl.
   *H01L 31/028*   (2006.01)
   *H01L 31/0296*  (2006.01)
   *H01L 31/0304*  (2006.01)
(52) U.S. Cl.
   CPC ...... *H01L 31/0296* (2013.01); *H01L 31/0304* (2013.01); *H01L 31/03046* (2013.01)

(56) References Cited

FOREIGN PATENT DOCUMENTS

| | | |
|---|---|---|
| WO | 2017088071 | 6/2017 |
| WO | 2019040486 | 2/2019 |

OTHER PUBLICATIONS

Dragomir Neshev and Igor Aharonovich: Optical metasurfaces: new generation building blocks for multi-functional optics; Light: Science & Applications (2018)7:58, pp. 1-5.
Hou-Tong Chen et al. : A review of metasurfaces : physics and applications; 2016, Rep. Prog, Phys., 79 076401, pp. 1-59.
V.J. Sorger et al.: Metasurfaces—from science to applications; Nanophotonics 2018; 7(6): 949-951.
D. Rodrigo et al.: Self-Similar Multiresonant Nanoantenna Arrays for Sensing from Near- to Mid-Infrared, ACS Photonics, vol. 5, 2018.
A. Lochbaum et al.: On-Chip Narrowband Thermal Emitter for Mid-IR Optical Gas Sensing, ACS Photonics, vol. 4, 2017.
F. Costa et al.: A Circuit-Based Model for the Interpretation of Perfect Metamaterial Absorbers, IEEE Transactions on Antennas and Propagation, vol. 61, 2013.
X. Zhu et al.: Resonant laser printing of structural colors on high-index dielectric metasurfaces, Science Advances, vol. 3, 2017.
Y. Zhang et al.: Significantly enhanced infrared absorption of graphene photodetector under surface-plasmonic coupling and polariton interference, Optics Express, vol. 26, 2018.
S. Cakmakyapan et al.: Gold-patched graphene nano-stripes for high-responsivity and ultrafast photodetection from the visible to infrared regime; Light: Science & Applications, 2018.
Q. Guo et al.: Efficient electrical detection of mid-infrared graphene plasmons at room temperature; Nature Materials, vol. 17, 2018.
C. Tan and H. Mohseni: Emerging technologies for high performance infrared detectors, Nanophotonics, 2018.
International Search Report and Written Opinion dated Jun. 26, 2019, PCT Patent Application No. PCT/EP2020/067229, filed Jun. 19, 2020, mailed on Sep. 30, 2020, European Patent Office, 16 pages.
Yang Wang, et al., "Metamaterial-Plasmonic Absorber Structure for High Efficiency Amorphous Silicon Solar Cells", Nano Letters, vol. 12, No. 1, Dec. 20, 2011, pp. 440-445.
Young Uk Jung, et al., "Numerical study of near-, mid-, and long-infrared photon trapping in crystalline and amorphous HgCdTe metamaterials", Applied Physics a materials science & Processing, Springer Berlin Heidelberg, Berlin/Heidelberg, vol. 122, No. 4, Mar. 14, 2016, pp. 1-6.
Shichao Song, et al., "Great light absorption enhancement in a graphene photodetector integrated with a metamaterial perfect absorber", Nanoscale, vol. 5, No. 20, Aug. 21, 2013, pp. 9615-9619, UK.

\* cited by examiner

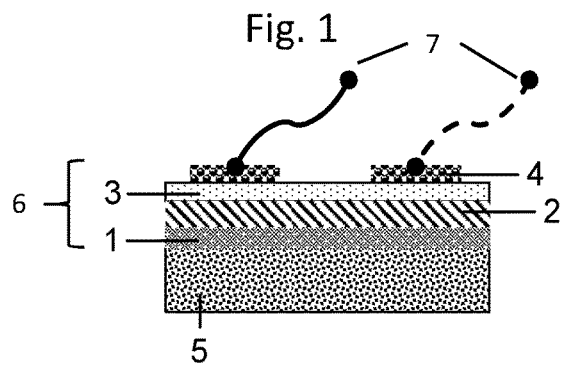
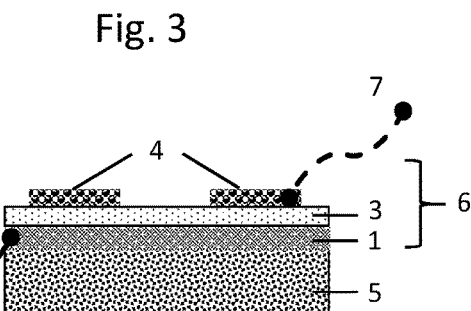
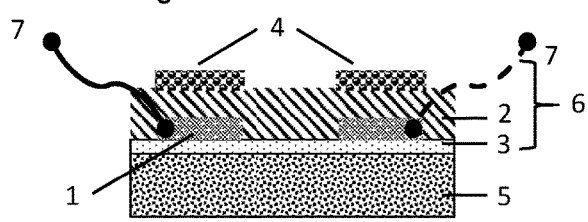
Fig. 1
Fig. 3
Fig. 2
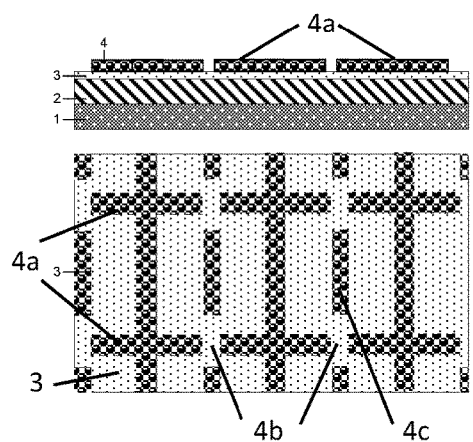
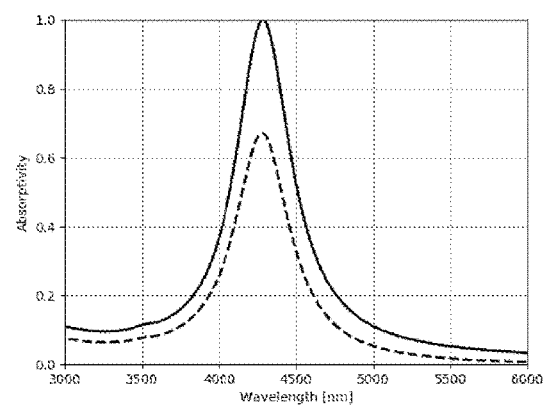
Fig. 4
Fig. 5

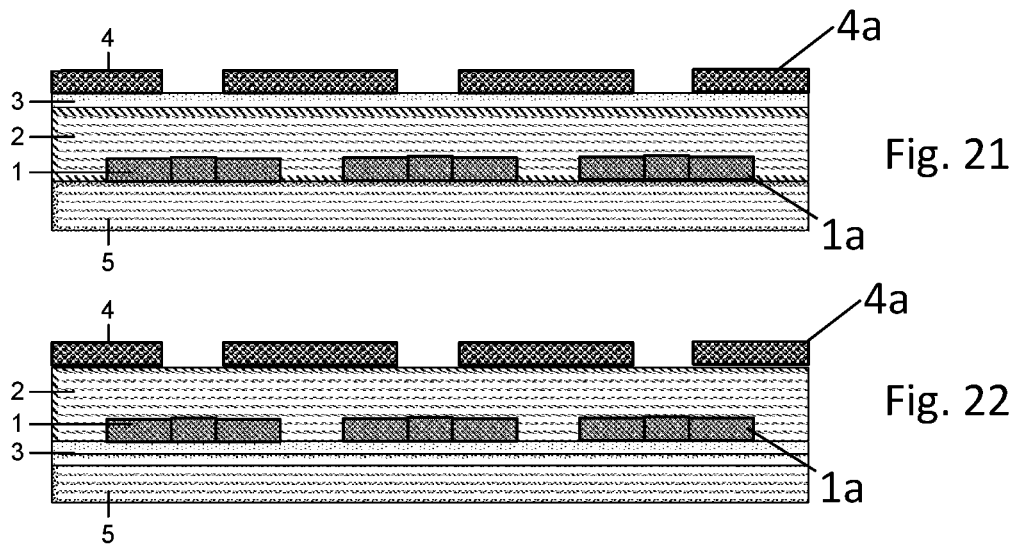
Fig. 21
Fig. 22
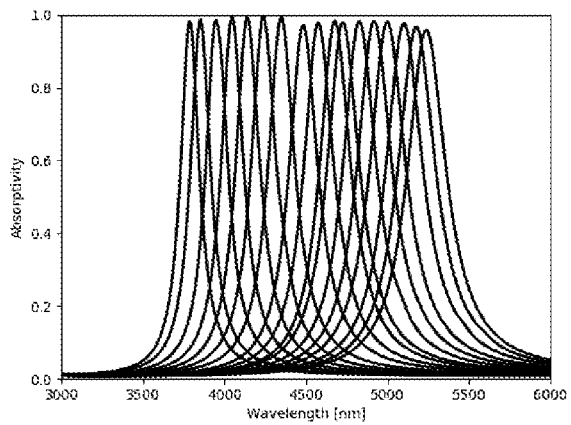
Fig. 23
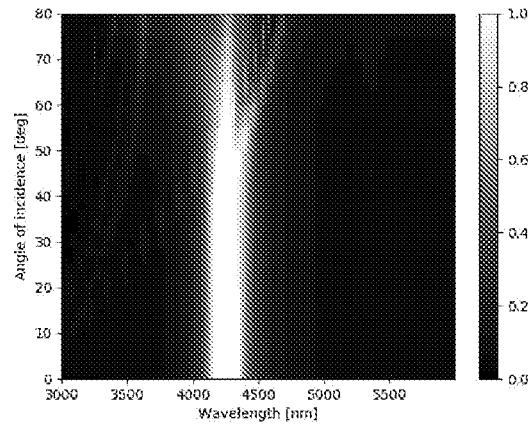
Fig. 24
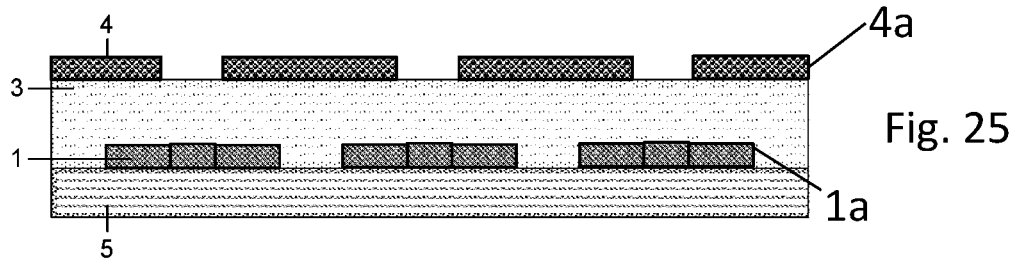
Fig. 25
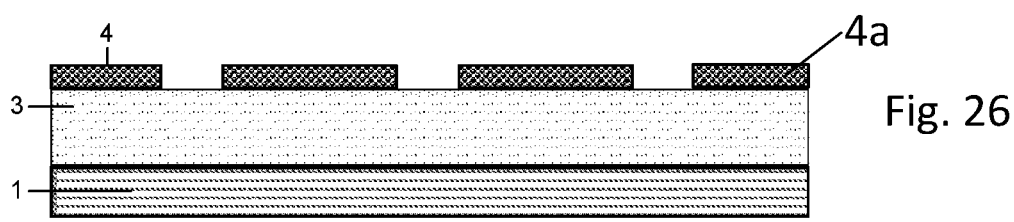
Fig. 26

META-SURFACE PHOTODETECTOR

CLAIM FOR PRIORITY

The present application is a national stage filing under 35 U.S.C 371 of PCT application number PCT/EP2020/067229, having an international filing date of Jun. 19, 2020, which claims priority to European patent application number 19183649.3 having a filing date of Jul. 1, 2019, the disclosures of which are hereby incorporated by reference in their entireties.

TECHNICAL FIELD

The present invention relates to a photodetector for detecting radiation of a band, in particular infrared radiation. Further it relates to an infrared-based gas sensor.

BACKGROUND ART

Photodetectors based on crystalline material are among the most efficient infrared (IR) photodetectors today. Photodetectors may be used to quantify an amount of incident radiation in a band, in particular it may be used to detect infrared radiation of a specific frequency or wavelength, e.g. for the detection and quantification of CO2, which has an absorption maximum at a wavelength of 4.3 μm, in the surrounding gas. The working principle of the photodetector may be understood as follows: Photons of the incident radiation are converted to charge carriers, e.g. electrons and holes, in the active material, i.e. a semiconducting material, if an energy of the photons matches properties of the active material, e.g. a band gap of the semiconducting material. The charge carriers may then be sensed by electrically contacting the active material, in particular by measuring a voltage or a current between electrodes contacting the active material. This working principle has been applied in conventional photodetectors which use monocrystalline material as the active material.

U.S. Pat. No. 8,698,207 shows a photodetector that includes at least one portion of a semiconducting layer formed directly on at least a portion of a reflective layer and to be illuminated with a light beam, at least one pad being formed on the portion of the semiconducting layer opposite the reflective layer portion, wherein the pad and the reflective layer portion are made of a metal or of a negative permittivity material, the optical cavity formed between said at least one reflective layer portion and said at least one pad has a thickness strictly lower than a quarter of the ratio of the light beam wavelength to the optical index of the semiconducting layer, and typically representing about one tenth of said ratio.

A main drawback of conventional photodetectors is the sophisticated techniques required for manufacturing high-quality monocrystalline material, e.g. by molecular beam epitaxy. Lower-quality material suffers from high recombination losses, in particular at crystal boundaries, which lead to poor-quality photodetectors.

It is hence an object of the present invention to provide a photodetector allowing to employ lower-quality material while maintaining a high detection quality, in order to decrease manufacturing efforts and thus to make high-quality photodetectors more accessible.

DISCLOSURE OF THE INVENTION

The object is achieved by a photodetector according to an aspect of the present invention. The photodetector comprises a substrate, and supported by the substrate a configuration configured to act as an optical resonator, i.e. to absorb incident radiation of a band, in particular infrared radiation. The configuration comprises a frontside structure faces the incident radiation. The frontside structure comprises frontside elements arranged in a periodic pattern. Periodic in this context is defined by the presence of at least two elements of the same shape and the same orientation, irrespective if interconnected or not. However, it is preferred that the number of frontside elements exceeds two by far, and preferably exceeds 50.

The frontside structure is a resonant frontside structure such that only radiation of a defined band optically resonates in the frontside structure. The resonation is in particular caused by the frontside elements. For this reason, the frontside structure is also referred to as frontside resonator. The resonant property of the frontside structure in combination with the rest of the resonator preferably leads to an absorption of incident radiation of the defined band only, but not to an absorption of incident radiation outside the band. The band may include a single wavelength or a range of wavelengths.

A backside structure is arranged between the frontside structure and the substrate. The backside structure serves as optical element that in combination with the frontside structure contributes to the optical resonating property of the configuration. Preferably, the backside structure is arranged and configured to match the input impedance of the resonator with that of surrounding media for an optimal light coupling. In one embodiment, the backside structure may include or be represented by a continuous backplane. In a different embodiment, the backside structure comprises backside elements arranged in a periodic pattern. For the latter embodiment, the backside structure also is referred to as backside resonator.

Accordingly, the frontside structure and the backside structure, e.g. in combination with a dielectric spacer in between, contribute to an optical resonator. Preferably, the frontside and the backside structure are arranged and configured to maximize the absorption in the band which absorption preferably is affected by an active material as introduced later on.

In this context, the material used for the frontside and backside structures preferably is sufficiently optically dense so that they can create a resonator or a reflective backside. Given that at least one of the frontside and backside structure additionally serves as electrical contact for the photodetector, at least this structure is made from electrically conducting material. In case only one of the frontside and the backside structure is made from electrically conducting material, the other structure preferably is made from a dielectric material. In another embodiment, both frontside and backside structure are made from an electrically conducting material, even if only one of the frontside and the backside structure is used for electrically contacting the photodetector. The frontside structure may e.g. be made of gold, and the backside structure may e.g. be made of aluminium.

In addition, a layer of an active material made from a semiconducting material is provided to convert at least part of the incident radiation into charge carriers, which process is understood as absorption of the radiation of the band. Accordingly, in contrast to other configurations converting the absorbed incident radiation into a thermal signal, the present configuration converts the absorbed incident radiation into an electrical signal. The photodetector according to the present invention comprises an amorphous or a polycrystalline material as the active material. Amorphous or polycrystalline material is simpler and cheaper to produce, in particular it may be obtained by sputtering methods and does not require molecular beam epitaxy. Moreover, amorphous or polycrystalline material sets less requirements on properties of the underlying substrate than crystalline material, which requires a specific lattice-matched substrate. The substrate according to the present invention may hence be a standard semiconductor substrate as e.g. used in CMOS processing. The active material preferably comprises indium antimonide, which shows properties well suited for absorbing infrared radiation and is simple to handle since it allows for more accessible fabrication techniques such as sputtering. Preferably, the active material comprises or consists of a III-V semiconductor, preferably one of gallium arsenide, aluminum arsenide, indium phosphide, indium gallium arsenide, aluminum indium arsenide, indium arsenide, gallium antimonide, aluminum antimonide, or most preferably indium antimonide. In a different embodiment, the active material comprises or consists of a II-VI semiconductor, in particular mercury telluride or cadmium telluride. In another embodiment, the active material comprises or consists of graphene, or other 2D-metamaterials e.g., transition metal dichalcogenides.

The frontside elements may on the one hand contribute to forming an optical resonator preferably having a filtering effect on the incident radiation. Properties of the optical resonator, in particular the band in which radiation is absorbed, depend on several parameters, such as the materials, shapes and dimensions of the configuration as a whole, in particular on a shape and extension of the frontside elements, a gap size between adjacent frontside elements, a thickness of the frontside structure, the same parameters for the backside structure including backside elements if any, and a thickness of the active material. The frontside element preferably is shaped as one or more of a cross, a zig-zag element, a meandering element, an arrow, a "U"-shape, a "V"-shape, an "S"-shape, an "I"-shape, a circle, clubs, an/or various interconnections of "S", "V", "U", "V", "I"-shapes. Also, an inverse of each of the above listed shapes may be applicable as frontside element. The zig-zag element pattern has the advantage that a corresponding frontside structure is by definition formed as stripes which are simple to contact electrically.

A frontside element preferably is a nanoscale element, i.e. its largest extension except for interconnection line length is assumed to be below 10 μm, preferably below 3 μm. Any extension of a frontside element except for its thickness preferably is the range between 100 nm and 10 μm, preferably in the range between 100 nm and 3 μm. The frontside elements may not be spaced too closely, preferably not closer than 10 nm at maximal spacing, since the photons of the incident radiation are desired to reach the active material in order to be converted to charge carriers. On the other hand, it is preferred that the minimum distance between adjacent frontside elements is not more than 2 μm, preferably not more than 500 nm, preferably not more than 200 nm.

In case of frontside element shapes other than stripes, multiple of the frontside elements are preferably interconnected and form a group. Preferably, in one embodiment, the frontside elements are grouped in at least two groups, one of the groups being contacted as anode, the other one as cathode. In one example, frontside elements are grouped into multiple groups. E.g., elements arranged adjacent in a given, e.g. vertical, direction are interconnected into a column group of frontside elements. This may result in multiple columns of interconnected frontside elements. Each second column may be interconnected, e.g. outside the pattern by appropriate wiring, such that in terms of electrical contact pattern interdigitated electrodes are generated. In the embodiment comprising groups of frontside elements, the minimum distance between adjacent frontside elements is the minimum distance of adjacent frontside elements belonging to different groups.

Preferably, the backside structure allows the optical resonator to be perfectly matched with a surrounding gas at the desired frequency, yielding efficient narrow-band absorbers for sensing. The backside structure may be a backplane, i.e. a continuous film made of an electrically conducting material or a stack of dielectric materials, and as such serve as broadband reflector. In another embodiment, the backside structure is a backside resonator comparable to the frontside resonator. Here, the backside structure may be made of an electrically conducting material or a dielectric material and serve as narrowband reflector. In the latter embodiment, the backside structure is formed by backside elements separated from each other by backside gaps and arranged in a periodic pattern. The backside element preferably is shaped as one or more of a cross, a zig-zag element, a meandering element, an arrow, a "U"-shape, a "V"-shape, an "S"-shape, an "I"-shape, a circle, club, an/or various interconnections of "S", "V", "U", "V", "I"-shapes. Also, an inverse of each of the above listed shapes may be applicable as backside element.

In particular the backside elements may be grouped into groups, with the backside elements of a group being electrically connected to each other. As to the shape, dimensions, patterns, gaps and distances of or between the backside elements the disclosure referring to the frontside elements is applicable.

In one embodiment, the backside structure is of the same type as the frontside structure. In this embodiment, the backside elements may also be arranged congruent with the frontside elements, however, in different planes. Or, in a different embodiment, the backside elements may be arranged offset from the frontside elements in the different planes.

In an embodiment, the frontside structure is in contact with the active material, the frontside structure is made of electrically conducting material, and only the frontside structure is connected to electrical contacts for sensing the charge carriers in the active material.

In a different embodiment, the backside structure is in contact with the active material, the backside structure is made of electrically conducting material and comprises backside elements arranged periodically, and only the backside structure is connected to electrical contacts for sensing the charge carriers in the active material.

In a further embodiment, the frontside structure and the backside structure are both in contact with the active material. Both, the frontside structure and the backside structure are made from electrically conducting material, and are connected to electrical contacts for sensing the charge carriers in the active material.

In particular, the electrical contacts include one of bond wires, metal lines of an integrated circuit, vias of an integrated circuit, solder balls, stud bumps solder balls, conductive glue, conductive ink, or metal lines of a redistribution layer. The charge carriers converted from photons of the incident radiation may typically be electrons and holes. Sensing the charge carriers may be performed by measuring a voltage or a current between the electrical contacts. The described double purpose of the frontside structure and/or the backside structure is a big advantage of the present invention over the prior art. Due to the optical resonator, the proposed photodetector acts as a photodetector plus an optical filter in one. Through the frontside structure and/or the backside structure, electrical and optical elements, which have fundamentally different purposes, are united in one layer. This facilitates a much simpler production of the photodetector than the conventional cointegration of different electrical and optical components with fundamentally differing properties.

By adjusting the parameters of the configuration, the properties of the optical resonator may preferably be tuned, and the band may be selected tuning the filtering effect of the configuration. The configuration leads to a field enhancement of the incident radiation which improves the absorption of incident radiation of the band in the active material. Such configuration, when it comprises a number of repeating resonant elements, is also termed a meta-surface. It can also be considered as a metamaterial perfect absorber (MPA), wherein the metamaterial property denotes an artificially behaving electromagnetic material that evokes an electromagnetic response typically not available in nature, and that preferably comprises meta-cells formed by periodic front (and if applicable back-) side periodic surfaces.

Accordingly, the properties of the frontside structure and of the backside structure influence the resonator properties of the configuration. Hence in one embodiment, an extension of each frontside element, and of each backside element if applicable, is dimensioned dependent on the band of radiation to be absorbed by the configuration. The extension may e.g. be a length or a width of the element measured in a plane of the corresponding structure. Some elements, of course have multiple dimensions defining the shape of the element in this plane. In such scenario, it is preferred that one of the dimensions/extensions is determined as critical dimension/extension responsible for the transmission of radiation in the desired band only. Preferably the critical extension of an element corresponds to the range from 0.01 L to 2.0 L where L is the center wavelength of the band. For example, a length of a cross element is the critical extension and is dimensioned between 0.5 L and 2.0 L, while its width as non-critical dimension may be between 0.01 L and 0.5 L. The width is considered non-critical since any wavelengths corresponding to its dimension are outside the optical range and as such are not further considered. Tolerance of each extension preferably varies depending on whether the extension is a critical parameter or not. For example, tolerance of a critical parameter such as the length of a cross would be within 20% to its optimal value, while its width can vary up to 500%. It is also possible to mix together different resonances by making the extension of the elements different in one direction of the plane from the dimension of the plane.

In an embodiment, the band of the incident radiation to-be-absorbed is centered around a center wavelength with an absorption peak, and an absorption spectrum around the center wavelength has a full width at half maximum of less than 0.5 µm. For the detection of CO2, the center wavelength is in particular 4.3 µm. In such case, the extension of each frontside element, and of each backside element if applicable, is preferably chosen to be around 1 µm.

In another embodiment, the band of the incident radiation to-be-absorbed is centered around a center wavelength with an absorption peak, and an absorption spectrum around the center wavelength has a full width at half maximum of less than 0.5 µm. For the detection of CH4 the center wavelength is in particular 3.3 µm. In such case, the extension of each frontside element, and of each backside element if applicable, is preferably chosen to be around 0.8 µm. In a further embodiment, this absorption band around 3.3 µm can likewise be used to detect refrigerants, in particular difluormethane (R32).

Further dimensions of the configuration are preferably as follows: Active layer material thickness between 10 and 50 nm, preferably 30 nm; frontside structure thickness and backside structure thickness between 50 and 500 nm, preferably 100 nm. The electrical contacts, i.e. cathode and anode, are preferably arranged very close to each other, i.e. within 10 to 500 nm. Thus photogenerated charge carriers do not need to travel long distances through the active material. This reduces a probability of charge carrier recombination, and facilitates high-quality measurements of the incident radiation, even if amorphous or polycrystalline material is used as the active material. Such closely-spaced electrical contacts with the active material are advantageously achieved via one or more of the frontside elements or backside elements, or in particular groups of frontside elements or backside elements.

Three general types of the configuration are proposed depending on which of the frontside and/or backside structure electrically contacts the active material: In type I and type II configurations, electrical contact with the active material is established through the frontside structure and the backside structure, respectively, but not through the respective other structure. In a type III configuration, the active material is electrically contacted via both the frontside structure and the backside structure.

For types I and II, the configuration preferably further comprises a dielectric spacer between the backside structure and the frontside structure. In particular the dielectric spacer may comprise silicon dioxide. In other embodiments, the spacer may comprise one or more of aluminum oxide, silicon nitride, zirconium oxide, hafnium oxide, titanium oxide. Such dielectric spacer relaxes the requirements put on the thickness of the active material by considerations concerning the optical resonator. If the configuration comprises a dielectric spacer, the thickness of the dielectric spacer may be adjusted, and the thickness of the active material may be generally chosen independent of the overall thickness of the configuration.

In an embodiment, the active material is arranged above the dielectric spacer and in contact with the frontside structure, and the electrical contacts contact the frontside structure, in particular groups of the frontside elements, but not the backside structure (type I). In the following, two specific embodiments of a type I configuration are proposed, wherein the following dimensions are understood to have a tolerance of 20% for the cross length, zig-zag shoulder length and the period, and of 500% for all other parameters:

Embodiment I.1: The frontside structure is formed as a split-cross pattern with a cross length of 914 nm across connection lines, a cross length of 901 nm along connection lines, a cross width of 194 nm across connection lines, a cross width of 264 nm along connection lines, a period of 1858 nm, and a thickness of 86 nm. The active material has a thickness of 30 nm, the dielectric spacer has a thickness of 113 nm, and the backside structure is a backplane formed as a continuous film with a thickness of 100 nm.

Embodiment I.2: The frontside structure is formed as a zig-zag element pattern with a gap between neighboring zig-zag elements of 150 nm, a zig-zag shoulder angle of 90°, a zig-zag shoulder length of 1756 nm, a width of zig-zag elements of 803 nm, and a thickness of 97 nm. The active material has a thickness of 30 nm, the dielectric spacer has a thickness of 41 nm, and the backside structure is a backplane formed as a continuous film with a thickness of 100 nm.

The dimensions of the two specific embodiments I.1 and I.2 are tuned to yield an absorption peak at 4.3 µm when using indium antimonide as the active material, gold for the frontside structure, aluminium for the backside structure, and silicon dioxide for the dielectric spacer.

Embodiment I.3: The frontside structure is formed as a split-cross pattern with a cross length of 652 nm across connection lines, a cross length of 623 nm along connection lines, a cross width of 201 nm across connection lines, a cross width of 241 nm along connection lines, a period of 1888 nm, and a thickness of 118 nm. The active material has a thickness of 30 nm, the dielectric spacer has a thickness of 115 nm, and the backside structure is a backplane formed as a continuous film with a thickness of 100 nm.

Embodiment I.4: The frontside structure is formed as a zig-zag element pattern with a gap between neighboring zig-zag elements of 150 nm, a zig-zag shoulder angle of 90°, a zig-zag shoulder length of 1485 nm, a width of zig-zag elements of 667 nm, and a thickness of 114 nm. The active material has a thickness of 30 nm, the dielectric spacer has a thickness of 53 nm, and the backside structure is a backplane formed as a continuous film with a thickness of 100 nm.

The dimensions of the two specific embodiments I.3 and I.4 are tuned to yield an absorption peak at 3.3 µm when using indium antimonide as the active material, gold for the frontside structure, aluminium for the backside structure, and silicon dioxide for the dielectric spacer.

In a type II embodiment, the active material is arranged above the substrate and in contact with the backside structure, and the electrical contacts contact the backside structure but not the frontside structure. The frontside structure preferably is transmissive in the band of incident radiation. Dimensions of the configuration may be chosen similar to the ones presented for the type I embodiments in such a way that dimensions of the back-resonator and front-resonator would match to make a perfect absorber at the desired wavelength.

In a type III embodiment, the active material is arranged between the backside structure and the frontside structure, and the electrical contacts contact the backside structure and the frontside structure. The backside structure may be formed as a backplane or a backplane resonator comprising backside elements.

According to another aspect of the present invention, an infrared-based gas sensor comprises the photodetector described above for absorbing infrared radiation of a band, and an infrared emitter configured to emit infrared radiation of the band. Further the infrared-based gas sensor comprises a determination unit, preferably integrated in the substrate, e.g. by CMOS processing. The determination unit is configured to determine a concentration of a gas compound in a surrounding dependent on the charge carriers sensed in the active material. In particular the concentration of the gas compound may be determined dependent on a voltage or a current measured between the electrical contacts. Such infrared-based gas sensor may in particular be used for the detection of $CO_2$ and a measurement of its concentration.

Other advantageous embodiments of photodetector are listed in the dependent claims as well as in the description below.

BRIEF DESCRIPTION OF THE DRAWINGS

Embodiments of the present invention, aspects and advantages will become apparent from the following detailed description thereof. The detailed description makes reference to the annexed drawings, wherein the figures show:

FIGS. 1 to 3 cut views through different resonant meta-surface photodetectors (corresponding to configurations of types I to III) according to embodiments of the present invention;

FIGS. 4 and 6 two possible frontside resonator patterns in a cut (above) and a top view (below) according to embodiments of the present invention;

FIGS. 5 and 7 absorption spectra for normal light incidence for the frontside resonator patterns of FIGS. 4 and 6, respectively;

FIGS. 21 and 22 two embodiments of photodetectors with the active material in contact with the frontside resonator and the backside resonator, respectively, according to the present invention;

FIG. 23 absorption spectra with a tunable central wavelength resulting from the embodiment of FIG. 21 with an inverted-cross resonator on the frontside and a cross resonator on the backside;

FIG. 24 angular dependence of one of the absorption spectra of FIG. 23;

FIGS. 25 and 26 two embodiments of meta-surface resonators without dielectric spacers with a backside resonator and a backplane, respectively, according to the present invention.

DETAILED DESCRIPTION OF THE DRAWINGS

Figure 6:
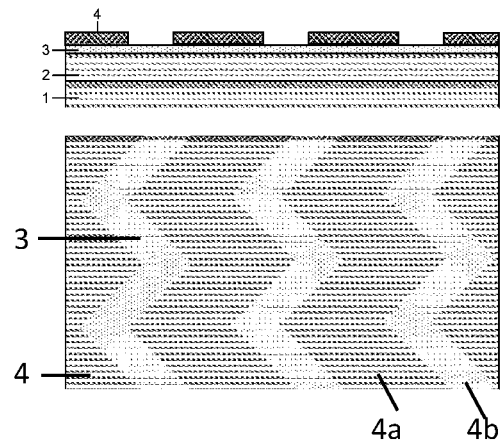

Same elements are referred to by same reference numerals across all figures.

FIGS. 1 to 3 show cut views through different resonant meta-surface photodetectors according to embodiments of the present invention. The embodiments of FIGS. 1, 2 and 3 correspond to three main proposed photodetector types I, II and III: In all three types, a configuration 6 is arranged on a substrate 5, which may be a usual semiconductor substrate as e.g. available from CMOS processing.

The configuration 6 of FIG. 1 (first type) comprises (from substrate to top) a backside structure 1, i.e. a backplane or a backside resonator, a dielectric spacer 2, a layer of an active material 3, and a frontside structure 4, i.e. a frontside resonator. The backplane/backside resonator 1 and the frontside resonator 4 are made from electrically conducting materials. For the purpose of the absorption spectra shown in the following, the backplane/backside resonator 1 is made from aluminium, and the frontside resonator 4 is made from gold. However, other metals are also possible. The dielectric spacer 2 may be made from silicon dioxide, or aluminum oxide, or silicon nitride, or zirconium oxide, or hafnium oxide or titanium oxide. The active material 3 comprises a semiconductor, in particular a III-V semiconductor, preferably one of gallium arsenide, aluminum arsenide, indium phosphide, indium gallium arsenide, aluminum indium arsenide, indium arsenide, gallium antimonide, aluminum antimonide, or most preferably indium antimonide. In a different embodiment, a II-VI semiconductor can be chosen for the active material 3, in particular mercury telluride or cadmium telluride. In yet another embodiment, graphene can be used as active material 3. Indium antimonide is chosen for the simulated absorption spectra shown in the following.

According to an embodiment of the present invention, the active material 3 does not need to be a monocrystalline material, which would be expensive to manufacture. In contrast, the active material 3 may be a polycrystalline or amorphous material. A high-quality detection of an incident radiation is nevertheless achieved due to a special wiring pattern: The active material 3 is electrically contacted through electrical contacts 7 (anode and cathode) that are very close to each other, i.e. only between 10 nm and 2000 nm apart, preferably between 10 nm and 500 nm, most preferably between 10 nm and 200 nm. Thus photogenerated charge carriers, such as electrons and holes, do not need to travel long distances through the active material 3 before being registered by the electrical contacts 7. This reduces a probability of charge carrier recombination, e.g. at crystal boundaries. The use of polycrystalline or amorphous material as active material 3 also relaxes requirements on the material of the substrate 5, which in the case of a crystalline active material needs to be a specific lattice-matched substrate. This opens various design possibilities, and makes manufacturing significantly cheaper.

In the photodetector of FIG. 1 (type I), the electrical contacts 7 contact the active material 3 from the top through the frontside resonator 4. The electrical contacts 7 are typically embodied as bond wires, however, may be embodied as different contact means as set out above.

The configuration 6 of FIG. 2 (type II) comprises (from substrate to top) a layer of an active material 3, a backside resonator 1, a dielectric spacer 2, and a frontside resonator 4. The electrical contacts 7 contact the active material 3 through the backside resonator 1.

The configuration 6 of FIG. 3 (type III) comprises (from substrate to top) a backplane/backside resonator 1, a layer of an active material 3, and a frontside resonator 4. The dielectric spacer 2 present in the first and second types is left out in the third type. The electrical contacts 7 contact the active material 3 from the top and from the bottom, i.e. through both, the backplane/backside resonator 1 and the frontside resonator 4.

FIGS. 4 and 6 show two possible frontside resonator patterns, each in a cut (above) and a top view (below), according to embodiments of the present invention. The shown resonator patterns are applied to photodetectors according to the first type (FIG. 1). The patterns are formed by elements 4a, and 4c for FIG. 4, which fill an entire top surface of the configuration 6 through a periodic repetition of the elements 4a, and 4c for FIG. 4. Neighboring elements 4a are separated by gaps 4b, such that the elements 4a may be used for independently contacting the active material 3 below.

The periodic pattern of elements 4a, and 4c for FIG. 4, of the frontside resonator 4 together with the underlying layer of active material 3, the dielectric spacer 2, and the backplane/backside resonator 1—together termed as the configuration 6—make up a so-called resonator meta-surface due to their effect on incident radiation, which in particular is a filter effect. While the configurations 6 shown in FIGS. 4 and 6 all show a backplane 1, it is also possible to use a backside resonator 1 instead, such that the filter effect of the configuration 6 can be altered further. In that case, the backside resonator 1 may display a similar pattern as the frontside resonator 4. The dimensions of the configurations 6 of FIGS. 4 and 6 given in the following are chosen for an intended use of the photodetector in the detection of CO2, i.e. a wavelength of an absorption peak of the configuration 6 is tuned to 4.3 µm which corresponds to the absorption maximum of CO2.

Figure 7:
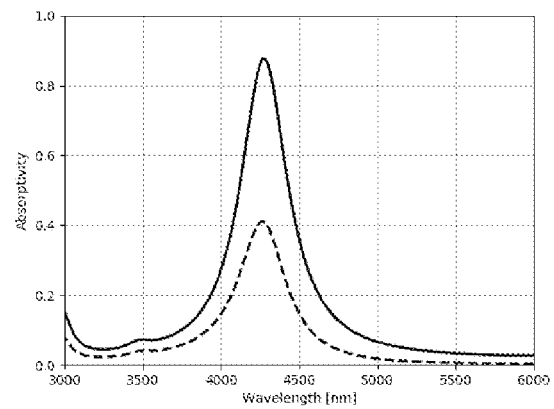

FIGS. 5 and 7 show absorption spectra for normal light incidence for the frontside resonator patterns of FIGS. 4 and 6, respectively. The absorption spectra are obtained by simulations on the basis of the dimensions given in the following. A solid line indicates overall absorptivity, and a dashed line indicates absorptivity per active material (unit 1 represents 100%).

The configuration 6 of FIG. 4 leading to the absorption spectrum of FIG. 5 comprises a frontside resonator 4 formed by split-cross-shaped elements 4a, called a "split-cross resonator meta-surface". The frontside resonator 4 is formed as a pattern of two differently shaped elements 4a and 4c, i.e. crosses 4a interconnected at opposite ends of only one bar of the respective cross. The elements 4a have a cross length of 914 nm across connection lines, the elements 4c have a cross length of 901 nm along connection lines. The elements 4a have a cross width of 194 nm across connection lines, the elements 4c have a cross width of 264 nm along connection lines. A period of the elements is 1858 nm, and a thickness is 86 nm (the Figures do not scale in this respect). The active material 3 has a thickness of 30 nm, the dielectric spacer 2 has a thickness of 113 nm, and the backside structure is a backplane formed as a continuous film with a thickness of 100 nm. Such configuration 6 yields a high absorptivity in a band that is centered around a center wavelength of 4.3 µm with an absorption peak of 1 as shown in FIG. 5. The absorption spectrum has a full width at half maximum of less than 0.5 µm around the center wavelength, such that it is well suited for a selective detection of CO2. The latter is also the case for the configuration of FIG. 6.

The configuration 6 of FIG. 6 leading to the absorption spectrum of FIG. 7 comprises a frontside resonator 4 formed as a zig-zag pattern, called a "zig-zag resonator meta-surface", i.e. the pattern periodically comprises zig-zag elements 4a of conducting material separated by zig-zag gaps 4b. The gap between zig-zag elements 4a has a width of 150 nm, a zig-zag shoulder angle is 90°, a zig-zag shoulder length is 1756 nm, a width of zig-zag elements is 803 nm. The frontside resonator 4 has a thickness of 97 nm, the active material 3 has a thickness of 30 nm, the dielectric spacer 2 has a thickness of 41 nm, and the backplane 1 has a thickness of 100 nm. Such configuration 6 yields a high absorptivity in a band that is centered around a center wavelength of 4.3 µm with an absorption peak of 1 as shown in FIG. 7.

FIGS. 8a to 8d show possible interconnections, i.e. contacting schemes, between elements of (frontside or backside) resonator patterns to contact the active material 3 of the photodetector according to embodiments of the present invention.

Figure 8A:
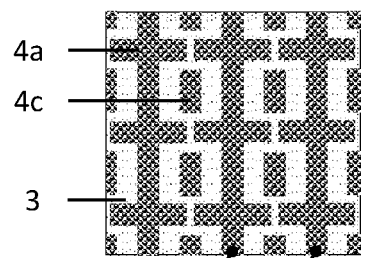
FIGS. 8*a* to 8*d* possible interconnections between elements of (frontside or backside) resonator patterns to contact an active material of the photodetector according to embodiments of the present invention.
Figure 8C:
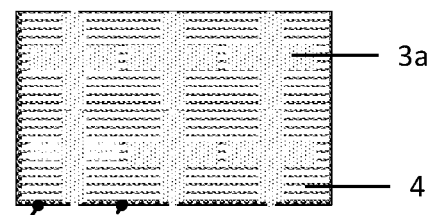
Figure 8B:
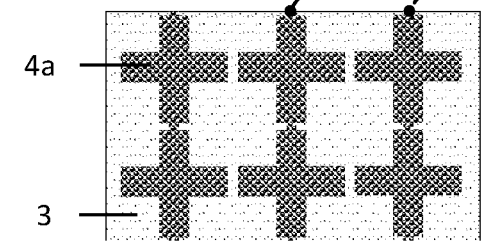

The resonators of FIGS. 8a and 8b are crossed-dipole type resonators. The resonator of FIG. 8a is formed as a pattern of two differently shaped elements 4a and 4c according to FIG. 4, whereas the resonator of FIG. 8b is formed by elements 4a shaped as crosses slightly different interconnected than the crosses 4a of FIG. 4. The electrical contacts 7 of the cathode (continuous line) and the anode (dashed line) contact columns of resonator elements 4a, which are interconnected with each other. This facilitates a small distance between points of contact with the active material 3, which is preferred if polycrystalline or amorphous active material 3 is used as proposed in an embodiment of the present invention.

The resonator of FIG. 8c is an inverted-crossed-dipole type resonator. The resonator 4 of FIG. 8c exhibits an inverted-cross pattern with respect to the pattern shown in FIG. 8b. The inverted-cross elements 3a are interconnected with each other in one dimension of the surface, i.e. the vertical dimension, while they remain separated by gaps in the other horizontal dimension of the surface. In this way, separated stripes of resonator material are formed, which are contacted by the electrical contacts 7, e.g. alternating cathode and anode. The resonator 4 of FIG. 8d comprises zig-zag stripe elements 4 similar to the ones of FIG. 6. The zig-zag stripe elements 4a are separated by zig-zag gaps 4b, and are contacted by electrical contacts 7, e.g. alternating cathode and anode. Again, such contacting scheme facilitates a small distance between points of contact with the active material 3, which is preferred if polycrystalline or amorphous active material 3 is used as proposed in an embodiment of the present invention.

FIGS. 9a to 9l illustrate further structures of (frontside or backside) resonators according to embodiments of the present invention. In most structures shown in FIG. 9, elements 4a arranged vertically in a column are interconnected to form a column of interconnected elements 4a, i.e. a group, preferably each of which group is electrically contacted. In contrast, elements 4a arranged horizontally in a row remain separated from each other by electrically isolating gaps 4b.

Figure 9A:
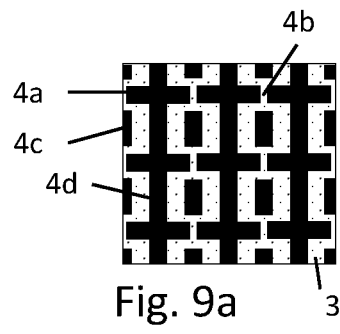
FIGS. 9*a* to 9*l* further possible interconnections between elements of (frontside or backside) resonator patterns to contact an active material of the photodetector according to embodiments of the present invention.
Figure 9B:
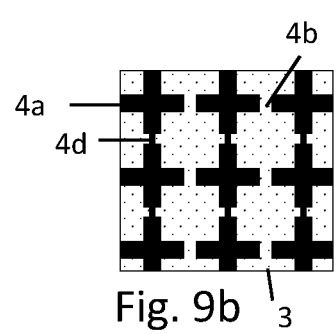
Figure 9C:
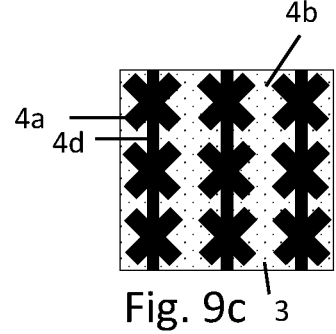

The resonators of FIGS. 9a to 9c are crossed-dipole type resonators. The resonator of FIG. 9a is formed as a pattern of two differently shaped elements 4a and 4c, i.e. crosses 4a and bars 4c. The same structure is also shown in FIG. 8a. The crosses 4a are interconnected at positions 4d to form columns of interconnected crosses 4a. The bars 4c are arranged between columns of crosses 4a. The resonator of FIG. 9b lacks the second type of elements, i.e. the bars 4c of FIG. 9a. The crosses 4a are interconnected at positions 4d to form groups of interconnected crosses 4a. In the structure of FIG. 9c, the crosses 4a of FIG. 9b are rotated by 45°, and centers of crosses 4a of a column are interconnected by interconnects 4d.

Figure 9D:
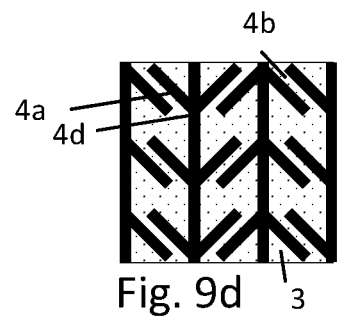
Figure 9E:
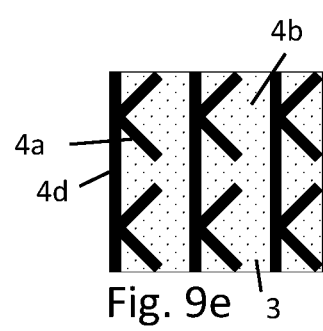

The resonator of FIG. 9d comprises arrow elements 4 interconnected at 4d to form respective groups. The structure of FIG. 9e comprises rotated "V"-shaped elements 4a elements 4 interconnected at 4d to form respective groups.

Figure 8D:
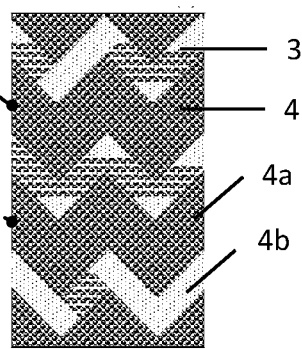
Figure 9F:
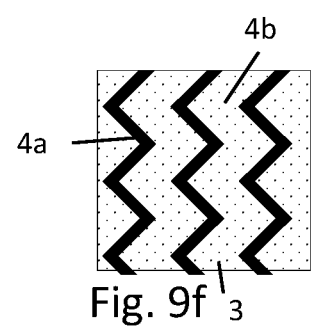

The structure of FIG. 9f comprises zig-zag stripe elements 4a as already shown in FIG. 8d. The zig-zag stripe elements 4a are separated by zig-zag gaps 4b. The structure of FIG. 9l instead comprises meandering stripe elements 4a separated by corresponding meandering gaps 4b.

Figure 9G:
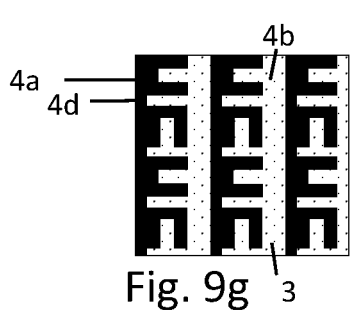
Figure 9H:
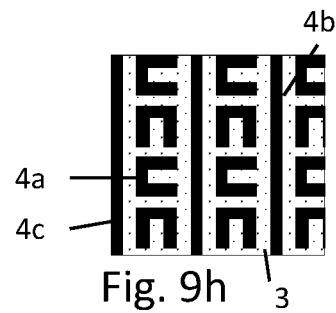

The structures of FIGS. 9g and 9h comprise "U"-shaped elements 4, wherein the "U"s of each row show the same orientation while the orientation of the "U"s in subsequent rows alternates by 90° back and forth. In FIG. 9g, the "U"-shaped elements 4a of a column are interconnected at 4d to a group, while the "U"-shaped elements a4 of FIG. 9h are disconnected from each other. Instead, a further element 4c in form of a vertical line is provided between each group of alternating oriented "U"s.

Figure 9I:
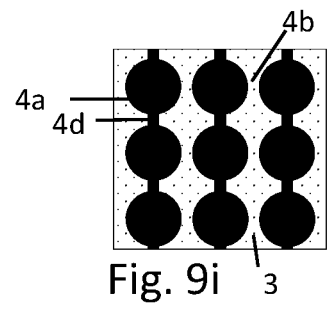
Figure 9J:
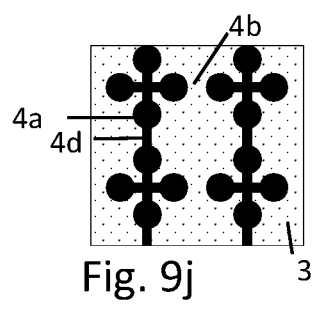
Figure 9K:
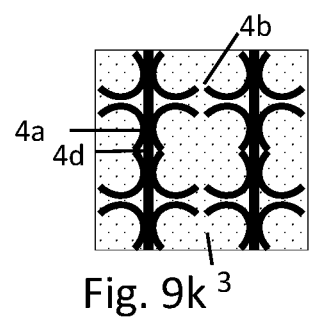
Figure 9L:
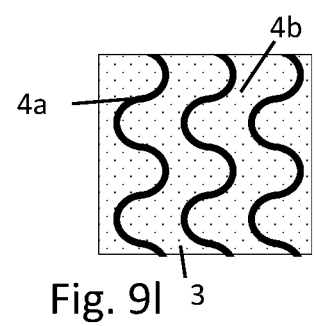

The structure of FIG. 9i comprises circular elements 4a interconnected at 4d per column. The structure of FIG. 9j comprises club-like elements 4 as known from card games interconnected at 4d per column. The structure of FIG. 9k comprises sophisticated elements 4 interconnected at 4d per column.

FIGS. 10 to 15 each shows a cut view through a resonant meta-surface photodetector according to an embodiment of the present invention. All these embodiments refer to configurations of type I).

Figure 10:
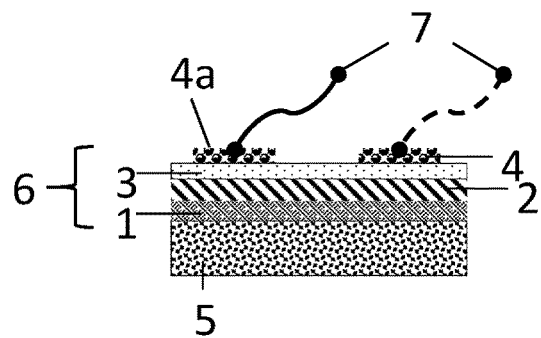
FIGS. 10 to 15 cut views through different resonant meta-surface photodetectors (corresponding to configurations of type I) according to embodiments of the present invention.

Arranged on a substrate 5, the configuration 6 of FIG. 10 comprises a backside structure 1, a dielectric spacer 2, a layer of an active material 3, and a frontside structure 4, i.e. a frontside resonator 4. The backside structure 1 is embodied as a continuous backplane. Electrical contacts 7 (anode and cathode), e.g. embodied as bond wires, contact the active material 3 from the top through the frontside resonator 4. The frontside resonator 4 includes elements 4a arranged on top of the layer of active material 3 which elements 4a are exposed. As to the materials used for the various layers and components, the dimensions, shapes, spacing, etc., it is referred to the description of the previous embodiments. Given that backplane 1, spacer 2 and active material 3 are of planar nature, only the frontside resonator 4 needs to be structured such that the photodetector if FIG. 10 is easy to manufacture.

Figure 11:
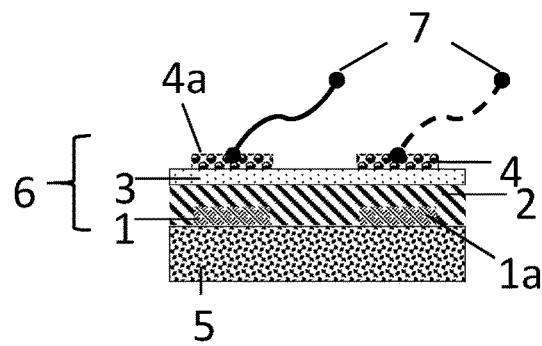

In contrast to the embodiment of FIG. 10, the embodiment of FIG. 11 shows a different backside structure 1, while all other elements are identical. The backside structure of FIG. 11 now is patterned and includes individual backside elements 1a so as to form a backside resonator 1. The backside elements 1a may be of the same shape as the frontside elements 4a; they are arranged congruent in different planes. By such means, the filtering effect of the configuration may further be improved.

Figure 12:
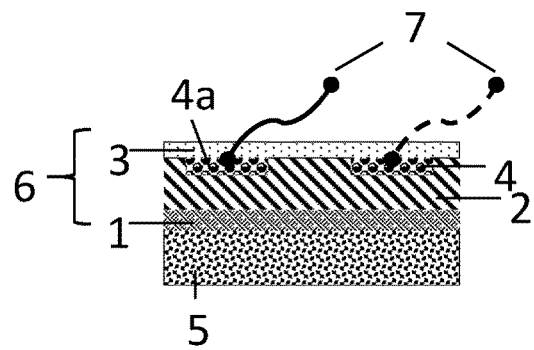

In contrast to the embodiment of FIG. 10, the embodiment of FIG. 12 shows a different arrangement of the frontside elements 4a of the frontside structure 4 while the backside structure 1 again is a backplane. The frontside elements 4a are now arranged between the spacer 2 and the layer of active material 3. For this reason, the frontside elements 4a are arranged e.g. in corresponding recesses in the spacer 2, or, alternatively, are deposited on top of the spacer 2 and are covered by the layer of active material 3. Again, the frontside elements 4a are made from electrically conducting material, and are contacted by electrical contacts 7. Such arrangement protects the frontside elements 4a.

Figure 13:
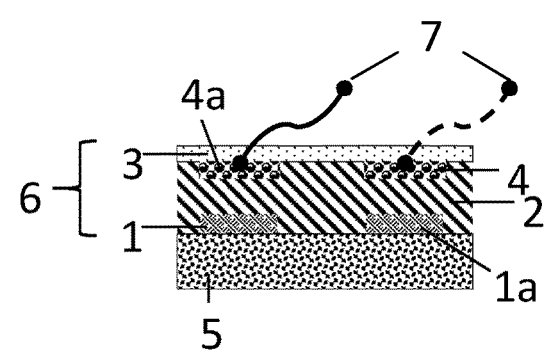

In contrast to the embodiment of FIG. 12, the embodiment of FIG. 13 shows a different backside structure 1, while all other elements are identical. The backside structure 1 of FIG. 13 now is patterned and includes individual backside elements 1a. The backside elements 1a may be of the same shape as the frontside elements 4a, and preferably are arranged congruent in different planes. By such means, the filtering effect of the configuration may further be improved while at the same time the frontside elements 4a are protected by the active material 3.

Figure 14:
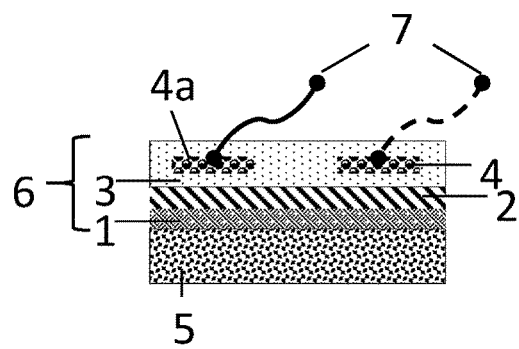

In contrast to the embodiment of FIG. 12, the embodiment of FIG. 14 shows a different arrangement of the frontside elements 4a while backside structure 1 again is a planar structure. Now, the frontside elements 4a are embedded/buried in the layer of active material 3. I.e. the frontside elements 4a are no longer in contact with the spacer 2. Again, the frontside elements 4a are made from electrically conducting material, and are contacted by electrical contacts 7. Here again, the frontside elements 4a are protected.

Figure 15:
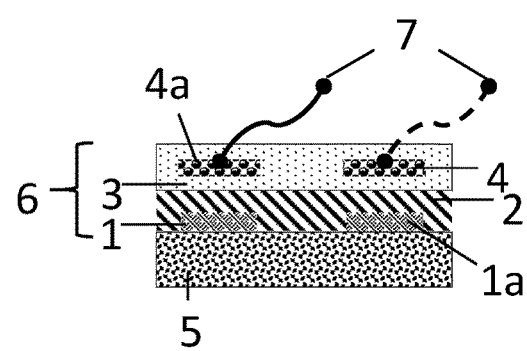

In contrast to the embodiment of FIG. 14, the embodiment of FIG. 15 shows a different backside structure 1, while all other elements are identical. The backside structure 1 of FIG. 15 is patterned and includes individual backside elements 1a. The backside elements 1a may be of the same shape as the frontside elements 4a and are arranged congruent in different planes. By such means, the filtering effect of the configuration may further be improved while at the same time the frontside elements 4a are protected by the active material 3.

Figure 16:
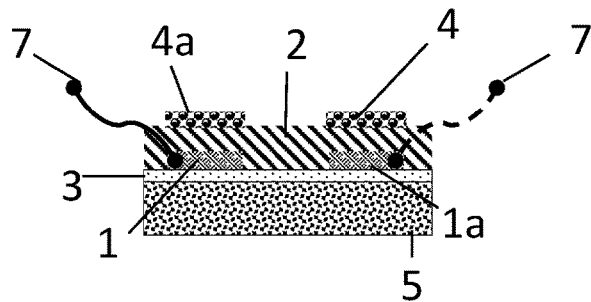
FIGS. 16 to 18 cut views through different resonant meta-surface photodetectors (corresponding to configurations of type II) according to embodiments of the present invention.
Figure 17:
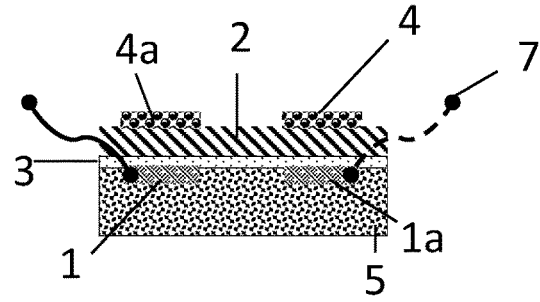
Figure 18:
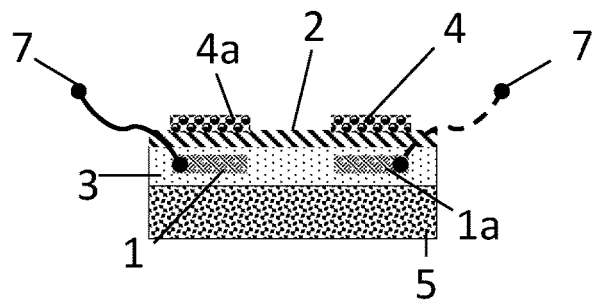

FIGS. 16 to 18 each shows a cut view through a resonant meta-surface photodetectors according to an embodiment of the present invention. All these embodiments refer to configurations of type II). The configuration 6 of FIG. 16 comprises, from the substrate 5 to the top, a layer of an active material 3, a dielectric spacer 2, and a frontside structure 4, i.e. a frontside resonator 4. The frontside resonator 4 includes elements 4a exposed and arranged on top of the layer of active material 3. However, the active material 3 in all these embodiments now is electrically contacted through a backside structure 1, by means of electrical contacts 7 (anode and cathode), e.g. embodied as bond wires. For this reason, the backside structure 1 comprises backside structure elements 1a. The backside elements 1a may be of the same shape as the frontside elements of the frontside structure 4, and preferably are arranged congruent in different planes. As to the materials used for the various layers and components, the dimensions, shapes, spacing, etc., it is referred to the description of the previous embodiments. In the embodiment of FIG. 16, the backside elements 1a are deposited on top of the layer of active material 3, and are covered by the subsequently applied material of the spacer 2.

In contrast to the embodiment of FIG. 16, the embodiment of FIG. 17 shows a different arrangement for the backside elements 1a, while all other elements are identical. The backside elements 1a of FIG. 17 now are arranged between the substrate 5 and the active material 3, instead of between the active material 3 and the spacer as is in FIG. 16.

Figure 19:
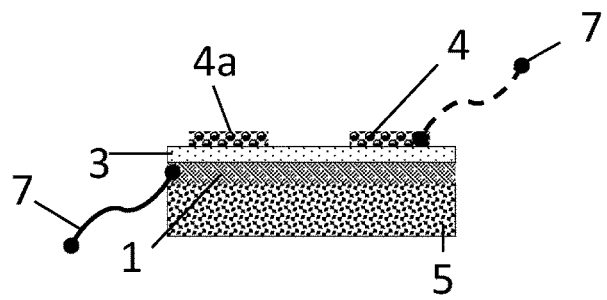
FIGS. 19 and 20 cut views through different resonant meta-surface photodetectors (corresponding to configurations of type III) according to embodiments of the present invention.

In contrast to the embodiment of FIGS. 16 and 19, the embodiment of FIG. 18 now comprises backside elements 1a embedded/buried in the layer of active material 3. Hence, the backside elements 1a are exclusively in contact with the active material 3.

Figure 20:
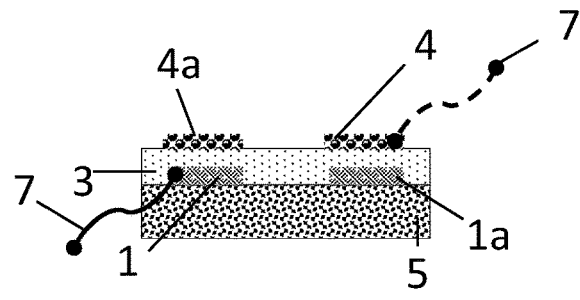

FIGS. 19 and 20 show cut views through different resonant meta-surface photodetectors corresponding to configurations of type III) according to embodiments of the present invention. The configuration 6 of FIG. 19 comprises, from the substrate 5 to the top, a backplane/backside resonator 1, a layer of an active material 3, and a frontside resonator 4. The dielectric spacer 2 present in type I) and type II) is omitted in the third type. The electrical contacts 7 contact the active material 3 from the top and from the bottom at the same time, i.e. through both, the backplane/backside resonator 1 and the frontside resonator 4. The frontside resonator 4 includes elements 4a arranged on top of the layer of active material 3 which elements 4a are exposed. The backside structure 1 comprises a continuous backplane.

In contrast to the embodiment of FIG. 19, the embodiment of FIG. 20 shows a different backside structure 1, while all other elements are identical. The backside structure 1 of FIG. 20 is patterned and includes individual backside elements 1a. The backside elements 1a may be of the same shape as the frontside elements 4a, and preferably are arranged congruent in different planes.

FIGS. 21 and 22 show two types of photodetectors with the active material 3 in contact with the frontside resonator 4 and the backside resonator 1, respectively, according to embodiments of the present invention. The configuration 6 of FIG. 21 corresponds to the one of FIG. 1 (first type: active material 3 electrically contacted by electrical contacts 7 through frontside resonator 4) with the difference that the backplane 1 of FIG. 1 is embodied as a backside resonator 1 including backside elements 1a, see FIG. 21. This facilitates a further tuning of the resonator properties, e.g. of a filtering effect on incident radiation.

The configuration 6 of FIG. 22 corresponds to the one of FIG. 2 (second type: active material 3 electrically contacted by electrical contacts 7 through backside resonator 1). In this configuration (second type), the backside-located active material 3 can also be of crystalline quality as it can be grown on a lattice-matched substrate 5, which is more difficult and expensive in the configuration of FIG. 21 (first type).

In the embodiments of FIGS. 21 and 22, the frontside elements 4a and the backside elements 1a preferably are arranged offset from each other in their respective planes.

FIG. 23 shows simulated absorption spectra with a tunable central wavelength resulting from the configuration of FIG. 21 with an inverted-cross resonator on the frontside and a cross resonator on the backside. It is shown that the central wavelength of the absorption peak can be tuned by modifying the dimensions characterizing the configuration.

FIG. 24 shows the angular dependence of the absorptivity for one of the absorption spectra of FIG. 11. Notably the absorption spectrum does not significantly change in center wavelength or shape of the absorption peak between an angle of incidence of 0° (normal incidence) and 45°. Even for angles of incidence between 45° and 90°, the absorption peak around a wavelength of 4.3 μm remains the main maximum in the absorptivity spectrum. Due to these properties, the configuration of FIG. 9 is well suited as a photodetector with a high sensitivity to one selected wavelength band.

FIGS. 25 and 26 show two types of meta-surface resonators without dielectric spacers. The configuration of FIG. 25 comprises a backside resonator 1 at the bottom (directly overlying the substrate 5), while in the configuration of FIG. 26, the bottom side is a backplane 1. In both configurations, the active material 3 is electrically contacted front-to-back, e.g. cathode contacts through frontside resonator 4 and anode contacts through backplane/backside resonator 1, instead of being laterally contacted as in the previous embodiments. In the embodiment of FIG. 25, the frontside elements 4a and the backside elements 1a preferably are arranged offset from each other in their respective planes.

While above there are shown and described embodiments of the invention, it is to be understood that the invention is not limited thereto but may be otherwise variously embodied and practiced within the scope of the following claims.

The invention claimed is:

1. A photodetector, comprising
a substrate; and
supported by the substrate a configuration configured to act as an optical resonator and to absorb incident radiation of a band, including infrared radiation,
the configuration comprising:
a resonant frontside structure comprising frontside elements arranged in a periodic pattern, the frontside structure facing the incident radiation;
a backside structure arranged between the frontside structure and the substrate, wherein the backside structure serves as an optical element that in combination with the frontside structure contributes to an optical resonating property of the configuration, the frontside structure being made from an electrically conducting material;

a layer of an active material made from a semiconducting material, and configured to convert at least part of the incident radiation of the band into charge carriers; and a dielectric spacer between the backside structure and the frontside structure, wherein the frontside structure is in contact with the active material, wherein the active material is arranged on top of the dielectric spacer, wherein the frontside structure is arranged between the dielectric spacer and the active material, or the frontside structure is arranged embedded in the active material, wherein the configuration is configured to selectively absorb the incident radiation of the band, wherein the frontside structure, but not the backside structure, is contacted by electrical contacts for sensing the charge carriers in the active material, wherein the active material comprises an amorphous or a polycrystalline material.

2. The photodetector of claim 1,
wherein the electrical contacts include one of bond wires, metal lines of an integrated circuit, vias of an integrated circuit, solder balls, stud bumps solder balls, conductive glue, conductive ink, or metal lines of a redistribution layer.

3. The photodetector of claim 1,
wherein the active material comprises one of
 a III-V semiconductor, preferably one of gallium arsenide, aluminum arsenide, indium phosphide, indium gallium arsenide, aluminum indium arsenide, indium arsenide, gallium antimonide, aluminum antimonide, or most preferably indium antimonide;
 a II-VI semiconductor, including mercury telluride or cadmium telluride;
 graphene.

4. The photodetector of claim 1,
wherein a minimum distance between adjacent frontside elements is in a range between 10 nm and 2000 nm, or between 10 nm and 500 nm, or between 10 nm and 200 nm,
wherein the frontside elements are grouped into groups, with the frontside elements of a group being electrically connected to each other,
wherein the groups of frontside elements are separated from each other by frontside gaps,
wherein a minimum distance between adjacent frontside elements belonging to different groups is in the range between 10 nm and 2000 nm, or between 10 nm and 500 nm, or between 10 nm and 200 nm,
wherein the frontside element is shaped as one or more of the following or its inverse:
 a cross,
 a zig-zag element,
 a meandering element,
 an arrow,
 clubs,
 a circle,
 a "V",
 a "U".

5. The photodetector of claim 1,
wherein the dielectric spacer comprises silicon dioxide, aluminum oxide, silicon nitride, zirconium oxide, hafnium oxide, or titanium oxide.

6. The photodetector of claim 1,
wherein within a tolerance of 20% for cross length and period and 500% for all other parameters the configuration has one of the following dimensions:
 the frontside structure comprises split-crosses with a cross length of 914 nm across connection lines, a cross length of 901 nm along connection lines, a cross width of 194 nm across connection lines, a cross width of 264 nm along connection lines, a period of 1858 nm, and a thickness of 86 nm, the active material has a thickness of 30 nm, the dielectric spacer has a thickness of 113 nm, and the backside structure is a backplane formed as a continuous film with a thickness of 100 nm;
 the frontside structure comprises zig-zag elements with a zig-zag element width of 150 nm, a zig-zag shoulder angle of 90°, a zig-zag shoulder length of 1756 nm, a width of zig-zag elements of 803 nm, and a thickness of 97 nm, the active material has a thickness of 30 nm, the dielectric spacer has a thickness of 41 nm, and the backside structure is a backplane formed as a continuous film with a thickness of 100 nm;
 the frontside structure comprises split-crosses with a cross length of 652 nm across connection lines, a cross length of 623 nm along connection lines, a cross width of 201 nm across connection lines, a cross width of 241 nm along connection lines, a period of 1888 nm, and a thickness of 118 nm, the active material has a thickness of 30 nm, the dielectric spacer has a thickness of 115 nm, and the backside structure is a backplane formed as a continuous film with a thickness of 100 nm;
 the frontside structure comprises zig-zag elements with a zig-zag element width of 150 nm, a zig-zag shoulder angle of 90°, a zig-zag shoulder length of 1485 nm, a width of zig-zag elements of 667 nm, and a thickness of 114 nm, the active material has a thickness of 30 nm, the dielectric spacer has a thickness of 53 nm, and the backside structure is a backplane formed as a continuous film with a thickness of 100 nm.

7. The photodetector of claim 1,
wherein the backside structure is a resonant backside structure comprising backside elements arranged in a periodic pattern.

8. The photodetector of claim 7,
wherein a minimum distance between adjacent backside elements is in a range between 10 nm and 2000 nm, or between 10 nm and 500 nm, or between 10 nm and 200 nm,
wherein the backside elements are grouped into groups, with the backside elements of a group being electrically connected to each other,
wherein a minimum distance between adjacent backside elements belonging to different groups is in the range between 10 nm and 2000 nm, or between 10 nm and 500 nm, or between 10 nm and 200 nm,
wherein the backside elements is shaped as one or more of the following or its inverse:
 a cross,
 a zig-zag element,
 a meandering element, an arrow,
clubs,
a circle,
a "V",
a "U".

9. The photodetector of claim 1,
wherein the band is centered around a center wavelength with an absorption peak, the center wavelength being one of 4.3 μm or 3.3 μm, and
wherein an absorption spectrum around the center wavelength has a full width at half maximum of less than 0.5 μm.

10. The photodetector of claim 1,
wherein an extension of each frontside element, and of each backside element if applicable, is dimensioned dependent on the band of radiation to be absorbed by the configuration,
wherein the extension within a tolerance of 20% corresponds to the center wavelength divided by four.

11. An infrared-based gas sensor comprising:
the photodetector of claim 1 for selectively absorbing infrared radiation of a band;
an infrared emitter configured to selectively emit infrared radiation of the band; and
a determination unit, integrated in the substrate, configured to determine a concentration of a gas compound in a surrounding dependent on the charge carriers sensed in the active material, dependent on a voltage or a current measured between the electrical contacts.

\* \* \* \* \*